United States Patent
Lee et al.

(10) Patent No.: US 7,732,310 B2
(45) Date of Patent: Jun. 8, 2010

(54) SIDEWALL MEMORY WITH SELF-ALIGNED ASYMMETRICAL SOURCE AND DRAIN CONFIGURATION

(75) Inventors: Tzyh-Cheang Lee, Hsinchu (TW); Fu-Liang Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 358 days.

(21) Appl. No.: 11/633,926

(22) Filed: Dec. 5, 2006

(65) Prior Publication Data

US 2008/0132015 A1  Jun. 5, 2008

(51) Int. Cl.
*H01L 21/425* (2006.01)

(52) U.S. Cl. .................... 438/525; 438/257; 438/202; 257/E21.059; 257/E21.619

(58) Field of Classification Search ............... 438/286, 438/302, 525, 299, 303, 216, 595, 324, 257, 438/262–264, FOR. 169; 257/324, E21.422, 257/E21.423, E21.059, E21.613, E21.619, 257/E21.62
See application file for complete search history.

(56) References Cited

U.S. PATENT DOCUMENTS

| | | | | |
|---|---|---|---|---|
| 5,258,319 A | * | 11/1993 | Inuishi et al. | 438/286 |
| 5,371,026 A | * | 12/1994 | Hayden et al. | 438/275 |
| 5,770,502 A | * | 6/1998 | Lee | 438/264 |
| 5,970,342 A | * | 10/1999 | Wu | 438/260 |
| 6,008,099 A | * | 12/1999 | Sultan et al. | 438/305 |
| 6,171,891 B1 | * | 1/2001 | Lee et al. | 438/197 |
| 6,297,098 B1 | * | 10/2001 | Lin et al. | 438/264 |
| 6,465,315 B1 | * | 10/2002 | Yu | 438/306 |
| 6,862,251 B2 | | 3/2005 | Yaoi et al. | |
| 2002/0045319 A1 | * | 4/2002 | Ogura et al. | 438/303 |
| 2004/0005750 A1 | * | 1/2004 | Chen et al. | 438/197 |
| 2005/0227434 A1 | * | 10/2005 | Wu et al. | 438/257 |

FOREIGN PATENT DOCUMENTS

| | | | |
|---|---|---|---|
| JP | 02-262833 | * | 12/1990 |
| TW | 1254320 | | 5/2006 |

* cited by examiner

*Primary Examiner*—Matthew Smith
*Assistant Examiner*—Quovaunda Jefferson
(74) *Attorney, Agent, or Firm*—Slater & Matsil, L.L.P.

(57) ABSTRACT

A method of forming a semiconductor structure includes providing a semiconductor substrate and forming a memory cell at a surface of the semiconductor substrate. The step of forming the memory cell includes forming a gate dielectric on the semiconductor substrate and a control gate on the gate dielectric; forming a first and a second tunneling layer on a source side and a drain side of the memory cell, respectively; tilt implanting a lightly doped source region underlying the first tunneling layer, wherein the tilt implanting tilts only from the source side to the drain side, and wherein a portion of the semiconductor substrate under the second tunneling layer is free from the tilt implanting; forming a storage on a horizontal portion of the second tunneling layer; and forming a source region and a drain region in the semiconductor substrate.

19 Claims, 5 Drawing Sheets

SIDEWALL MEMORY WITH SELF-ALIGNED ASYMMETRICAL SOURCE AND DRAIN CONFIGURATION

TECHNICAL FIELD

This invention relates generally to semiconductor devices, and more particularly to memory cells, and even more particularly to a structure and manufacturing methods of flash memory cells.

BACKGROUND

Flash memory has become increasingly popular in recent years. A typical flash memory comprises a memory array having a large number of flash memory cells arranged in blocks. A typical flash memory cell includes a storage layer capable of holding charges and that is electrically insulated from source and drain regions contained in a substrate by a layer of thin oxide (tunneling oxide). Each of the memory cells can be electrically charged by injecting electrons through the tunneling oxide layer into the storage layer. The charges can be removed from the storage layer by tunneling the electrons to the substrate through the tunneling oxide layer during an erase operation. Thus, the data in a memory cell is determined by the presence or absence of charges in the storage layer.

FIG. 1 illustrates a conventional memory cell having an asymmetric source and drain configuration. The memory cell includes two gate spacers, which includes storage layers. On the drain side, a storage layer 8 is separated from substrate 2 and gate electrode 4 by a tunneling layer 6. A further oxide layer 10 may be formed on storage layer 8. The spacer on the source side has a same structure as on the drain side. A lightly doped source region 12 is formed on the source side, wherein no lightly doped drain region is formed on the drain side. The state of storage layer 8 determines the threshold voltage of the memory cell. If electrons are stored, the memory cell exhibits a low threshold voltage. Conversely, if there are no electrons stored, the memory cell exhibits a high threshold voltage. The state of the memory cell may be determined by applying a voltage on word-line (gate electrode 4), wherein the voltage is between the high threshold voltage and the low threshold voltage. If the memory cell conducts, it is known that storage layer 8 has electrons stored therein. Otherwise, storage layer 8 has no electrons stored.

Conventionally, to form a lightly doped source region only, a non self-aligned formation method is used. As is illustrated in FIG. 2, photoresist 16 is formed to cover the drain side when lightly doped source region 12 is implanted. This process works for large-scale integrated circuit formation technologies. However, with the scaling of integrated circuits, the alignment of edge 18 of photoresist 16 with gate electrode 4 becomes increasingly difficult. A misalignment may cause edge 18 of photoresist 16 to fall on the left or right side of gate electrode 4, and thus a circuit failure may occur.

Accordingly, what is needed in the art is an improved method for forming memory cells having an asymmetric source and drain configurations.

SUMMARY OF THE INVENTION

In accordance with one aspect of the present invention, a method of forming a semiconductor structure includes providing a semiconductor substrate and forming a memory cell at a surface of the semiconductor substrate. The step of forming the memory cell includes a gate dielectric on the semiconductor substrate and a control gate on the gate dielectric; forming a first and a second tunneling layer on a source side and a drain side of memory cell, respectively; tilt implanting a lightly doped source region underlying the first tunneling layer, wherein tilt implanting tilts only from the source side to the drain side, and wherein a portion of the semiconductor substrate under the second tunneling layer is free from the tilt implanting; forming a storage on a horizontal portion of the second tunneling layer; forming a source region and a drain region in the semiconductor substrate.

In accordance with yet another aspect of the present invention, a method of forming a semiconductor structure includes providing a semiconductor substrate; forming a gate stack comprising forming a gate dielectric on the semiconductor substrate and forming a control gate on the gate dielectric; forming a dielectric layer on the gate stack and the semiconductor substrate; patterning the dielectric layer to form two tunneling layers on opposite sidewalls of the gate stack, wherein the tunneling layers each comprise a vertical portion on a sidewall of the gate stack and a horizontal portion on a top surface of the semiconductor substrate; tilt implanting an impurity into the semiconductor substrate to form a lightly doped source region and a lightly doped drain region, wherein the tilt implanting only tilts from a source side to a drain side; forming a storage layer after the step of forming the dielectric layer; patterning the storage layer to form storages, wherein each of the storages is on a horizontal portion of one of the tunneling layers; and implanting a source region and a drain region using the storages as masks.

In accordance with yet another aspect of the present invention, a method of forming and operating a memory cell includes providing a semiconductor substrate; forming a gate stack comprising forming a gate dielectric on the semiconductor substrate and forming a control gate on the gate dielectric; forming tunneling layers on opposite side of the gate stack, wherein each of the tunneling layer comprises a vertical portion on a sidewall of the gate stack and a horizontal portion on a top surface of the semiconductor substrate; forming storages wherein each of the storages is on a horizontal portion of one of the tunneling layers; tilt implanting an impurity into the semiconductor substrate after the step of forming the storages to form a lightly doped source region and a lightly doped drain region; and implanting a source region and a drain region using the storages as masks. The tilt implanting only tilts from a source side to a drain side. The lightly doped source region and the lightly doped drain region are both spaced apart from respective edges of the control gate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIGS. 3 through 8 illustrate cross-sectional views of intermediate stages in the manufacture of a first embodiment of the present invention. Shallow trench isolation (STI) regions (not shown) may be formed in substrate 20. The STI regions may be formed by etching shallow trenches in substrate 20 and filling the trenches with an insulator such as silicon oxide. However, when forming memory cell arrays, wherein the memory cells are serially connected, STI regions may not be formed between serially connected memory cells. In one embodiment, substrate 20 is formed of a bulk material such as silicon. In alternative embodiments, substrate 20 has a structure of silicon-on-insulator (SOI), which includes a silicon layer on a buried oxide (BOX) layer (not shown).

Figure 1:
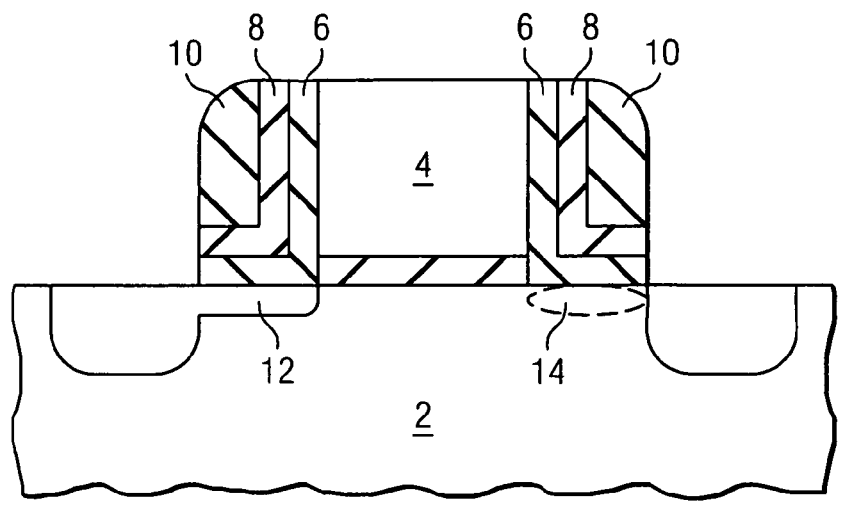
FIG. 1 illustrates a conventional memory cell having an asymmetric source and drain configuration.
Figure 2:
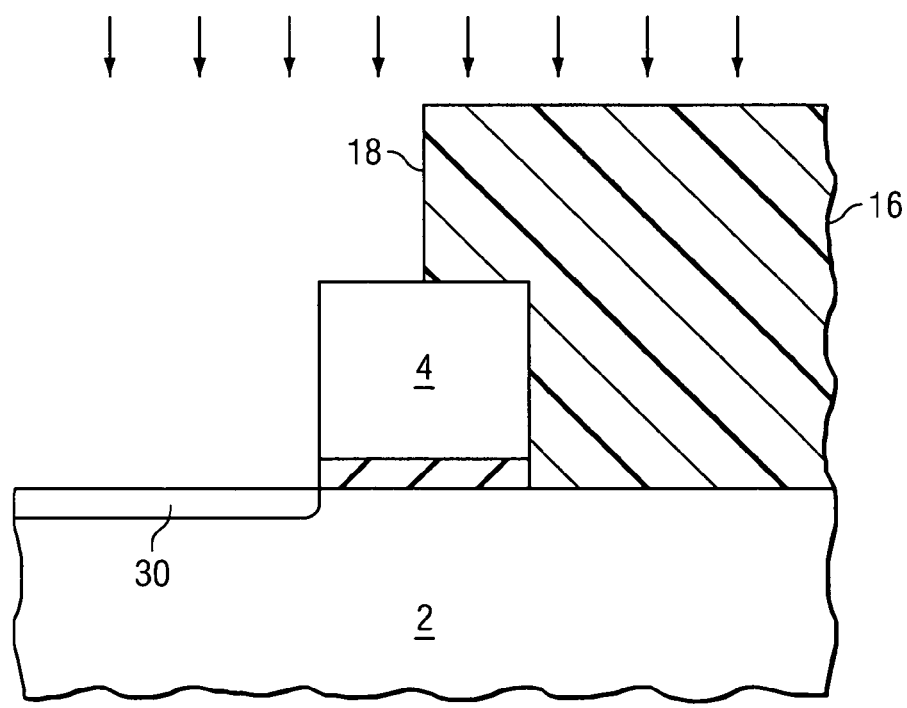
FIG. 2 illustrates an intermediate stage in the formation of the memory cell shown in FIG. 1, wherein a photoresist is formed to mask drain side during the formation of a lightly doped source region.
Figure 3:
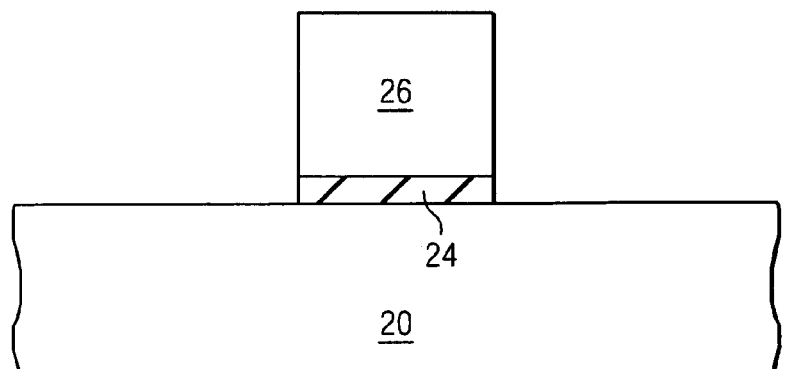
FIGS. 3 through 8 are cross-sectional views of intermediate stages of a first embodiment of the present invention, wherein a lightly doped source region is formed before the formation of a storage.

FIG. 3 further illustrates the formation of gate dielectric 24 and control gate 26. Gate dielectric 24 may include commonly used dielectric materials, such as silicon oxide, silicon nitride, silicon oxynitride, high-k materials such as HfAlO, $HfO_2$, $Ta_2O_5$, $ZrO_2$, and the like, and combinations thereof. Control gate 26 may include polysilicon, metals, metal silicides, metal nitrides, and combinations thereof. As is known in the art, gate dielectric 24 and control gate 26 may be formed by forming a control gate layer on a gate dielectric layer, and then patterning the stacked layers. The preferred methods for depositing the gate dielectric layer and the control gate layer include commonly used deposition techniques, such as plasma enhanced chemical vapor deposition (PECVD), low-pressure chemical vapor deposition (LPCVD), sub-atmospheric chemical vapor deposition (SACVD), and the like.

Figure 4:
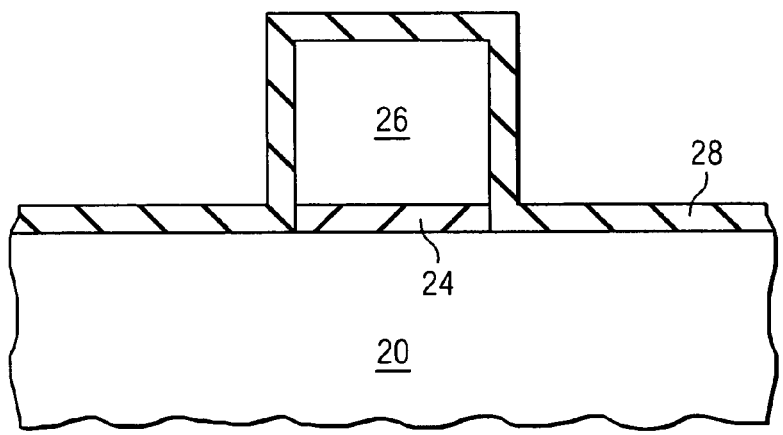

Referring to FIG. 4, tunneling layer 28 is blanket formed, covering substrate 20 and sidewall of gate dielectric 24 and control gate 26. In one embodiment, tunneling layer 28 comprises oxide, such as silicon oxide formed by thermal oxidation. In other embodiments, silicon oxynitride may be used. In yet other embodiments, tunneling layer 28 comprises high-k dielectric materials, such as HfAlO, $HfO_2$, $Ta_2O_5$, $ZrO_2$, and the like. Tunneling layer 28 preferably has a thickness of between about 30 Å and about 100 Å.

Figure 5:
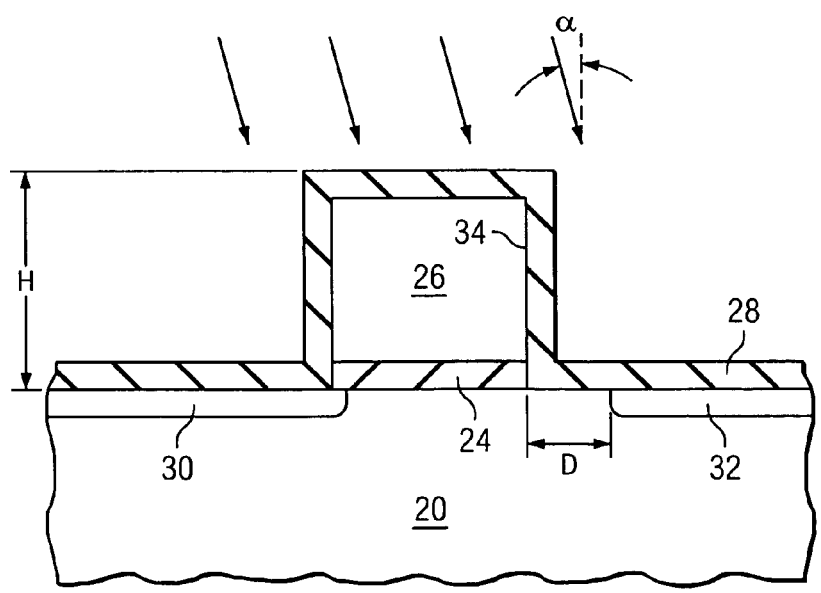

A tilt implant is then preformed to form lightly doped source region 30 and lightly doped drain region 32, as illustrated in FIG. 5. The atoms of the implanted impurity penetrate tunneling layer 28 into substrate 20. Depending on the type of the resulting memory cell, either an n-type impurity, such as phosphorus, or a p-type impurity, such as boron, is implanted. Preferably, the tilt implant is tilted from source side toward drain side. Accordingly, lightly doped source region 30 is closer to the respective edge of control gate 26 than lightly doped drain 32. Lightly doped drain region 32 is horizontally spaced apart from the respective edge 34 of control gate 26. In the preferred embodiment, the lateral distance D between lightly doped drain region 32 and edge 34 is between about 100 Å and about 200 Å. One skilled in the art will realize, however, that the preferred distance D and other recited dimensions throughout the description may scale accordingly with the technology used for forming integrated circuits. The preferred tilt angle α may be roughly calculated based on the height H, which is the vertical distance from a top surface of tunneling layer 28 to a top surface of the substrate 20. For example, with height H equal to about 800 Å and a preferred lateral distance D of about 100 Å, tilt angle α is preferably about 7 degrees. With height H equal to about 800 Å and a preferred lateral distance D of about 200 Å, tilt angle α is about 15 degrees.

It is appreciated that the order for forming tunneling layer 28 and tilt implanting is merely a design choice, and the order can be reversed.

Figure 6A:
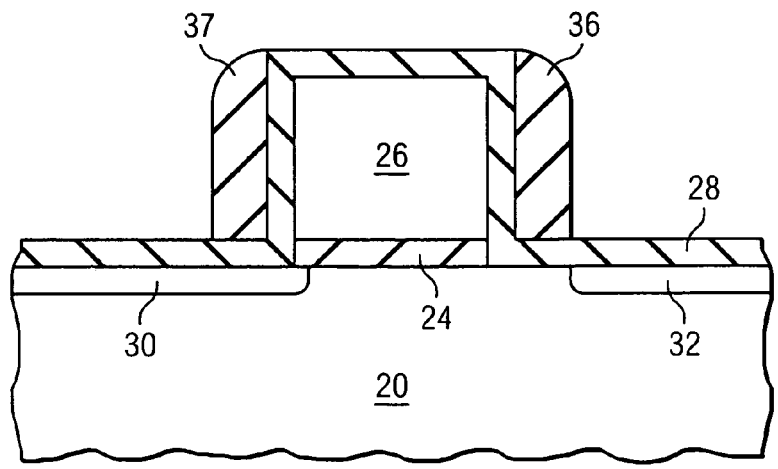

FIG. 6A illustrates the formation of storages 36 and 37. In the preferred embodiment, storages 36 and 37 comprise silicon nitride, which comprises isolated traps for trapping charges. In other embodiments, other dielectric materials having relatively high trap densities, such as $Al_2O_3$, $HfO_2$, HfON, ZrON, and combinations thereof, may be used. In yet other embodiments, conductive materials such as polysilicon can be used. Preferably, storages 36 and 37 are formed by blanket depositing a storage layer, and patterning the storage layer to remove horizontal portions. In the case storages 36 and 37 comprise silicon nitride, dry etching may be used for the patterning.

Figure 6B:
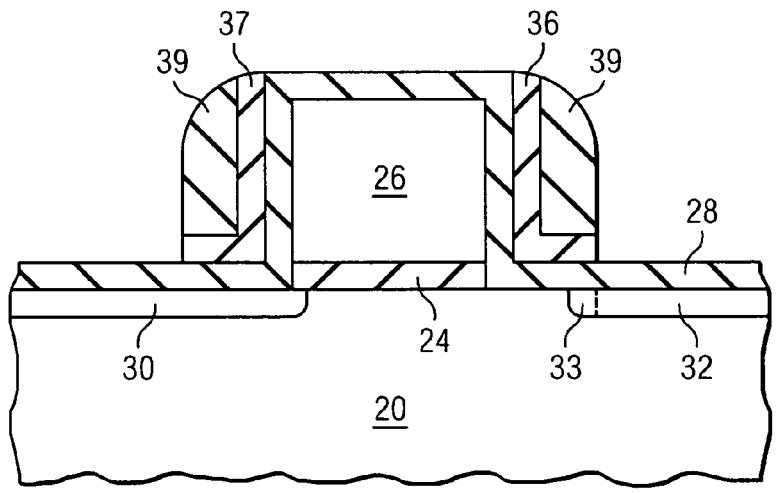

FIG. 6B illustrates another embodiment of the present invention, wherein storages 36 and 37 have an L-shape. Dielectric materials 39 are formed on the horizontal legs of storages 36. Dielectric materials 39 may be formed of oxides, oxynitrides, nitrides, and the like. One skilled in the art will realize the corresponding formation processes. Please note that FIG. 6B also illustrates an embodiment wherein lightly doped drain region 32 extends underlying storage 36. After the subsequent source/drain formation process, lightly doped drain region 32 is likely to have a small portion 33 not overlapping the drain region (not shown).

Figure 7:
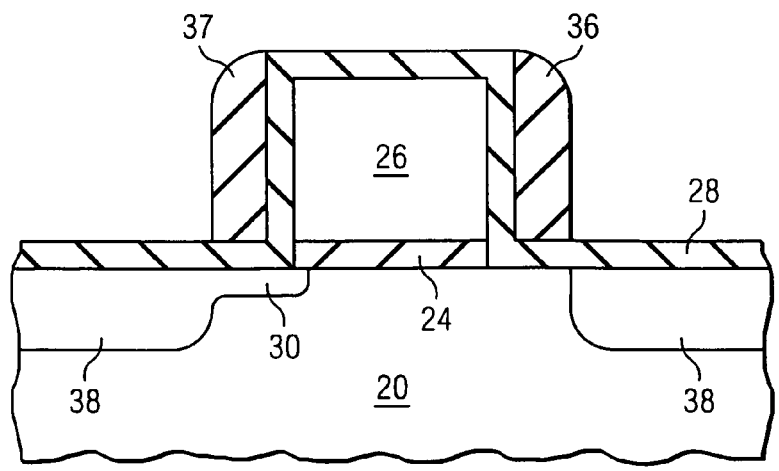

FIG. 7 illustrates the formation of source/drain regions 38. As is known in the art, source/drain regions 38 may be formed by implanting an n-type or a p-type impurity. In the resulting structure, source/drain regions 38 are substantially aligned with outer edges of the respective storages 36 and 37. Source/drain regions 38 may completely overlap lightly doped drain region 32, as illustrated in FIG. 7, or leaving a small portion 33 of lightly doped drain region 32 not overlapped (refer to FIG. 6B). After the formation of source/drain regions 38, the portions of tunneling layer 28 not covered by storages 36 and 37 are removed.

Figure 8:
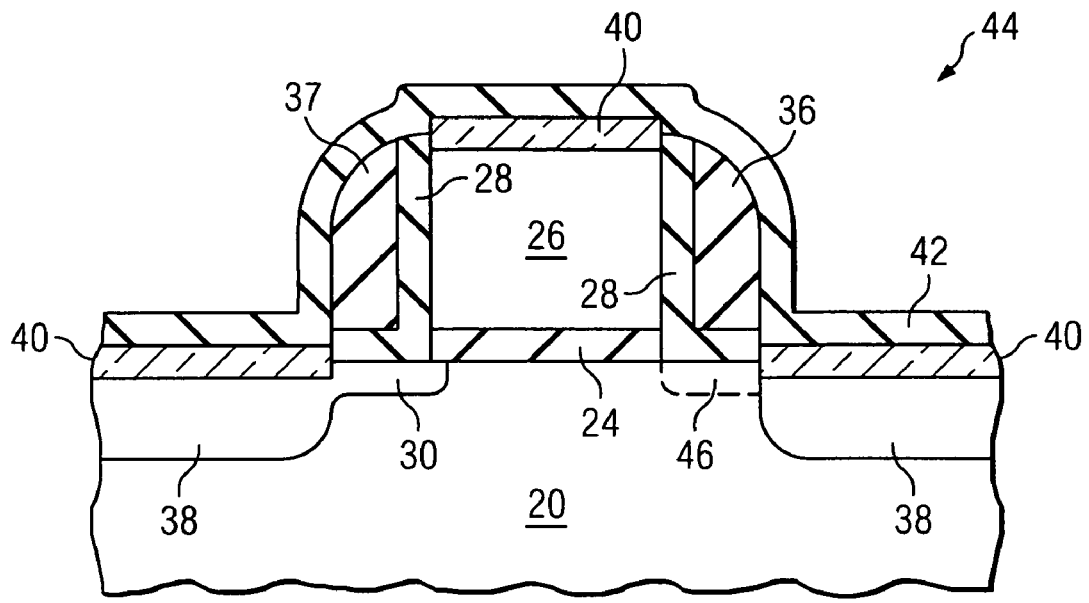

FIG. 8 illustrates the formation of silicide regions 40 and contact etch stop layer 42. As is known in the art, the formation of silicide regions 40 preferably includes blanket depositing a thin layer of metal (not shown). Substrate 2 is then heated, which causes silicon to react with the metal where contacted. After the reaction, a layer of metal silicide is formed between silicon and metal. The un-reacted metal is selectively removed through the use of an etchant that attacks metal but not silicide. Contact etch stop layer 42, which is used for stopping the etching process of a subsequently formed inter-layer dielectric, is then formed. Memory cell 44 is thus formed.

In the resulting memory cell 44, with a lightly doped source region 30, the threshold voltage observed by the source side is low. In other words, lightly doped source region 30 may easily conduct when voltages for reading memory cell 44 are applied. On the drain side, however, channel region 46 is free from both LDD implantation and source/drain implantation. This causes the threshold voltage observed by the drain side of the memory cell to increase for a PMOS device and to decrease for an NMOS device. For a PMOS device, when electrons are stored in storage 36, the threshold voltage observed by the drain side is reduced, and channel region 46 may be turned on by voltages applied for read operations. Conversely, when electrons are erased from storage 36, the threshold voltage observed by the drain side is increased, and channel region 46 under storage 36 is turned off even though voltages for read operations are applied. The state of memory cell 44 can thus be determined based on its conductance state.

Figure 9:
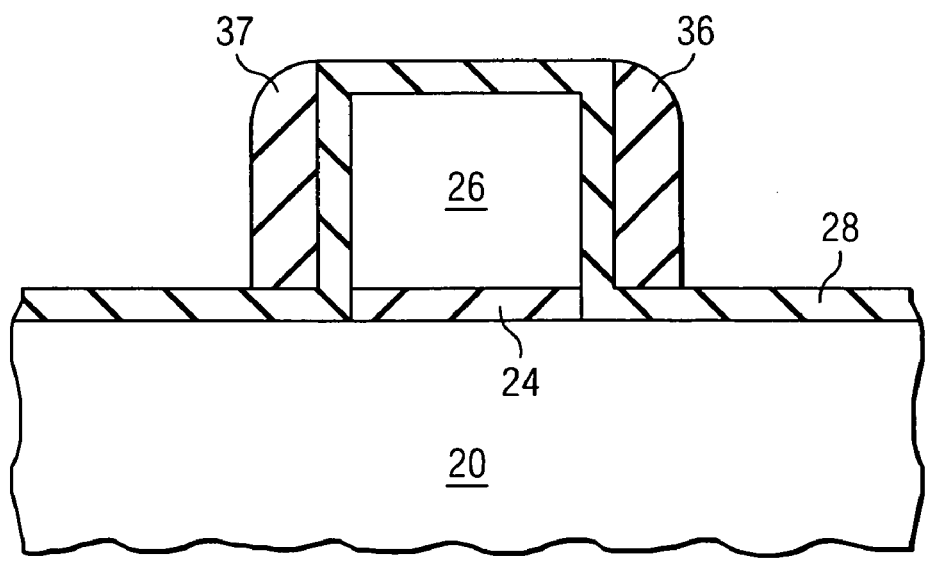
FIGS. 9 through 11 are cross-sectional views of intermediate stages of a second embodiment of the present invention, wherein a lightly doped source region is formed after the formation of a storage.
Figure 10:
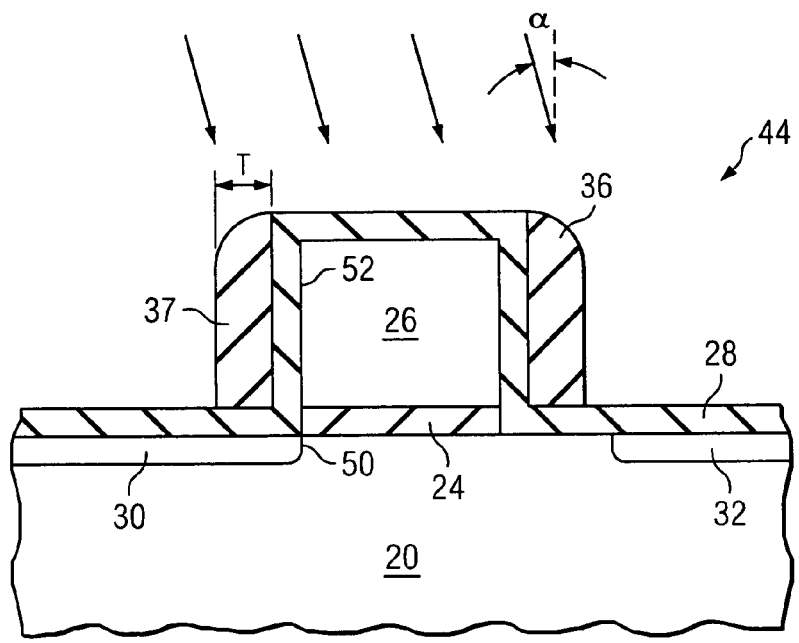
Figure 11:
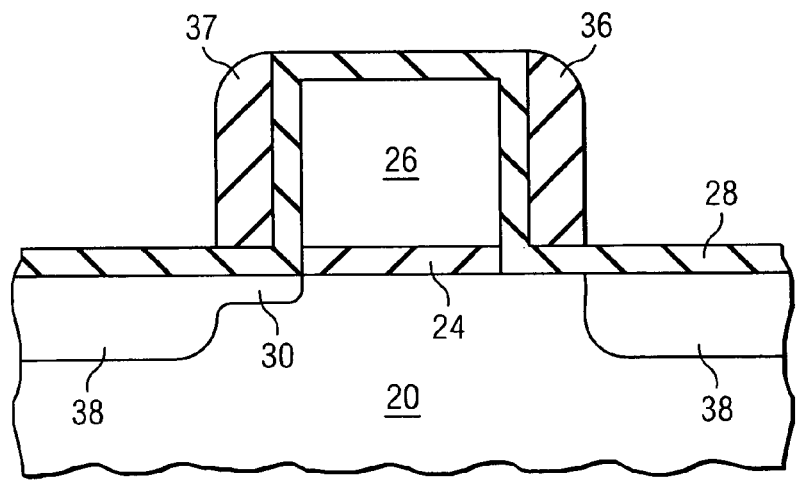

FIGS. 9 through 11 illustrate a second embodiment of the present invention. The initial steps of the second embodiment are similar to the steps shown in FIGS. 3 and 4. Referring to FIG. 9, after the formation of tunneling layer 28, storages 36 and 37 are formed, which may be formed of essentially the same materials and through essentially the same processes as discussed in the first embodiment.

The tilt implantation of lightly doped source region 30 and lightly doped drain region 32 is then performed, as is shown in FIG. 10. FIG. 11 illustrates the formation of source/drain regions 38, wherein the formation process has been discussed in the preceding paragraphs.

Figure 12:
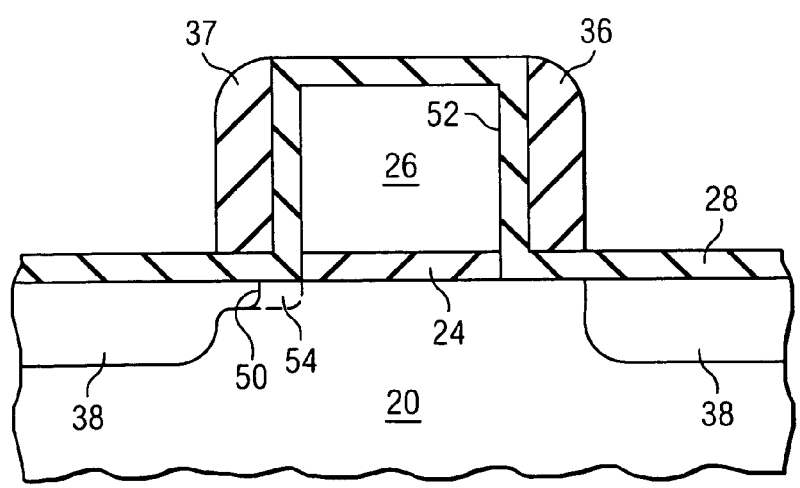
FIG. 12 illustrates a cross-sectional view of a memory cell having an asymmetric source and drain configuration, wherein a lightly doped source region is laterally spaced apart from a respective edge of a control gate.

Due to the masking of storages 36 and 37, lightly doped source region 30 and lightly doped drain region 32 are laterally spaced apart further from the channel region 46 of memory cell 44. Referring back to FIG. 10, depending on the thickness T of storages 36 and 37 and the tile angle α, lightly doped source region 30 may extend under storage 37 for different distances. In the embodiment shown in FIG. 10, edge 50 of lightly doped source region 30 is substantially aligned with edge 52 of control gate 26. In other embodiments, edge 50 extends under control gate 26, similar to what is shown in FIG. 7. In yet other embodiments, as illustrated in FIG. 12, edge 50 is laterally spaced apart from edge 52, and thus a non-overlap region 54 is formed. During read operations of memory cell 44, non-overlap region 54 must be turned on. In the preferred embodiment, a reverse read voltage is applied on source region, wherein the drain region is applied with a lower voltage than the source region. The reverse read voltage causes a depletion region to be formed in non-overlap region 54, so that electrons can pass the depletion region. In an exemplary reverse read operation, the source region is applied with a voltage of about 1.0V to about 1.5V, while the drain region is applied with 0V.

An advantageous feature of the present invention is that the formation of asymmetric LDD regions are self-aligned. The formation processes of the asymmetric memory cell may thus be scaled with the scaling of technologies without alignment issues.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
   providing a semiconductor substrate; and
   forming a memory cell at a surface of the semiconductor substrate comprising:
   forming a gate dielectric on the semiconductor substrate;
   forming a control gate on the gate dielectric;
   forming a first and a second tunneling layer on a source side and a drain side of memory cell, respectively, wherein the first and the second tunneling layers each comprise a vertical portion on sidewalls of the gate dielectric and the control gate, and a horizontal portion on a top surface of the semiconductor substrate;
   tilt implanting a lightly doped source region underlying the first tunneling layer, wherein the tilt implanting tilts only from the source side to the drain side, and wherein a portion of the semiconductor substrate under the second tunneling layer is free from the tilt implanting;
   forming a storage on the horizontal portion of the second tunneling layer;
   forming a source region in the semiconductor substrate and adjacent to the first tunneling layer; and
   forming a drain region in the semiconductor substrate and adjacent to the second tunneling layer;
   wherein the completed formed drain region is spaced apart from a respective edge of the control gate and at least a portion of the second tunneling layer overlies a portion of the semiconductor substrate free from impurities from the tilt implanting and the forming of the drain region.

2. The method of claim 1, wherein the step of tilt implanting is performed after the step of forming the storage.

3. The method of claim 1, wherein the storage comprises silicon nitride.

4. The method of claim 1, wherein the lightly doped source region comprises a portion underlying the control gate.

5. The method of claim 1, wherein the lightly doped source region is spaced apart from a respective edge of the control gate.

6. The method of claim 1, wherein the storage is L-shaped, and wherein the memory cell further comprises a dielectric material on a horizontal portion of the storage, and wherein the dielectric material does not extend over the drain region.

7. A method of forming a semiconductor structure, the method comprising:
   providing a semiconductor substrate;
   forming a gate stack comprising:
   forming a gate dielectric on the semiconductor substrate; and
   forming a control gate on the gate dielectric;
   forming a dielectric layer on the gate stack and the semiconductor substrate;
   patterning the dielectric layer to form two tunneling layers on opposite sides of the gate stack, wherein the tunneling layers each comprise a vertical portion on a sidewall of the gate stack and a horizontal portion on a top surface of the semiconductor substrate;
   tilt implanting an impurity into the semiconductor substrate to form a lightly doped source region and a lightly doped drain region, wherein the tilt implanting only tilts from a source side to a drain side;

forming a storage layer after the step of forming the dielectric layer;

patterning the storage layer to form storages, wherein each of the storages is on a horizontal portion of one of the tunneling layers; and implanting a source region and a drain region using the storages as masks;

wherein the completed formed drain region including the lightly doped drain region is spaced apart from a respective edge of the control gate and at least a portion of the second tunneling layer overlies a portion of the semiconductor substrate free from impurities implanted during the tilt implanting and the implanting of the drain region.

8. The method of claim 7, wherein the lightly doped drain region is spaced apart from a respective edge of the control gate by between about 100 Å and about 200 Å.

9. The method of claim 7, wherein the step of tilt implanting is performed before the step of forming the dielectric layer.

10. The method of claim 7, wherein the step of tilt implanting is performed after the step of forming the dielectric layer and before the step of forming the storage layer.

11. The method of claim 7, wherein the step of implanting is performed after the step of patterning the storage layer.

12. The method of claim 7, wherein the step of implanting the source and the drain regions is performed before the step of patterning the dielectric layer.

13. The method of claim 7, wherein the dielectric layer has a thickness of between about 30 Å and about 100 Å.

14. The method of claim 7, wherein the storages comprise silicon nitride.

15. The method of claim 7, wherein the lightly doped drain region comprises a portion not overlapped by the drain region.

16. he method of claim 7, wherein the lightly doped drain region is overlapped by the drain region.

17. A method of forming a memory cell, the method comprising:

providing a semiconductor substrate;

forming a gate stack comprising:

forming a gate dielectric on the semiconductor substrate; and forming a control gate on the gate dielectric;

forming tunneling layers on opposite side of the gate stack, wherein each of the tunneling layer comprises a vertical portion on a sidewall of the gate stack, and a horizontal portion on a top surface of the semiconductor substrate;

forming storages, wherein each of the storages is on a horizontal portion of one of the tunneling layers;

tilt implanting an impurity into the semiconductor substrate after the step of forming the storages to form a lightly doped source region and a lightly doped drain region, wherein the tilt implanting only tilts from a source side to a drain side, and wherein the lightly doped source region and the lightly doped drain region are both spaced apart from respective edges of the control gate; and implanting a source region and a drain region using the storages as masks.

18. The method of claim 17, wherein the lightly doped source region and a respective edge of the control gate have a first distance, and wherein the lightly doped drain region and a respective edge of the control gate have a second distance, and wherein the first distance is less than the second distance by greater than about 100 Å.

19. The method of claim 17, wherein the lightly doped drain region is overlapped by the drain region.

* * * * *